United States Patent
Lim et al.

(10) Patent No.: US 6,905,964 B2
(45) Date of Patent: Jun. 14, 2005

(54) METHOD OF FABRICATING SELF-ALIGNED METAL BARRIERS BY ATOMIC LAYER DEPOSITION ON THE COPPER LAYER

(75) Inventors: Boon Kiat Lim, Singapore (SG); Alex See, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/339,185

(22) Filed: Jan. 9, 2003

(65) Prior Publication Data

US 2004/0137721 A1 Jul. 15, 2004

(51) Int. Cl.[7] .............................................. H01L 21/44
(52) U.S. Cl. ........................ 438/687; 438/638; 438/641; 438/648; 438/656; 438/674; 438/685
(58) Field of Search ........................ 438/687, 637–646, 438/685, 678–679, 672–675, 653–654, 648, 633, 627–629

(56) References Cited

U.S. PATENT DOCUMENTS

| | | | |
|---|---|---|---|
| 6,258,713 B1 | 7/2001 | Yu et al. ..................... | 438/634 |
| 6,274,932 B1 | 8/2001 | Mikagi ........................ | 257/754 |
| 6,281,127 B1 | 8/2001 | Shue ........................... | 438/691 |
| 6,284,646 B1 | 9/2001 | Leem ......................... | 438/629 |
| 6,287,965 B1 | 9/2001 | Kang et al. ................. | 438/648 |
| 6,291,334 B1 | 9/2001 | Somekh ...................... | 438/620 |
| 6,416,822 B1 * | 7/2002 | Chiang et al. .............. | 427/561 |
| 6,605,874 B2 * | 8/2003 | Leu et al. ................... | 257/758 |
| 2004/0087136 A1 * | 5/2004 | Wu et al. .................... | 438/629 |

* cited by examiner

Primary Examiner—Thanh Nguyen
(74) Attorney, Agent, or Firm—George O. Saile; Rosemary L. S. Pike; Stephen B. Ackerman

(57) ABSTRACT

An improved and new process for fabricating self-aligned metal barriers by atomic layer deposition, ALD, capable of producing extremely thin, uniform, and conformal metal barrier films, selectively depositing on copper, not on silicon dioxide interlevel dielectric, in multi-layer dual damascene trench/via processing. Silicon nitride is presently used as a insulating copper barrier. However, silicon nitride has a relatively high dielectric constraint, which deteriorates ICs with increased RC delay. Copper metal barriers of niobium and tantalum have been deposited by atomic layer deposition on copper. With high deposition selectivity, the barrier metal is only deposited over copper, not on silicon dioxide, which eliminates the need of an insulating barrier of silicon nitride.

27 Claims, 3 Drawing Sheets

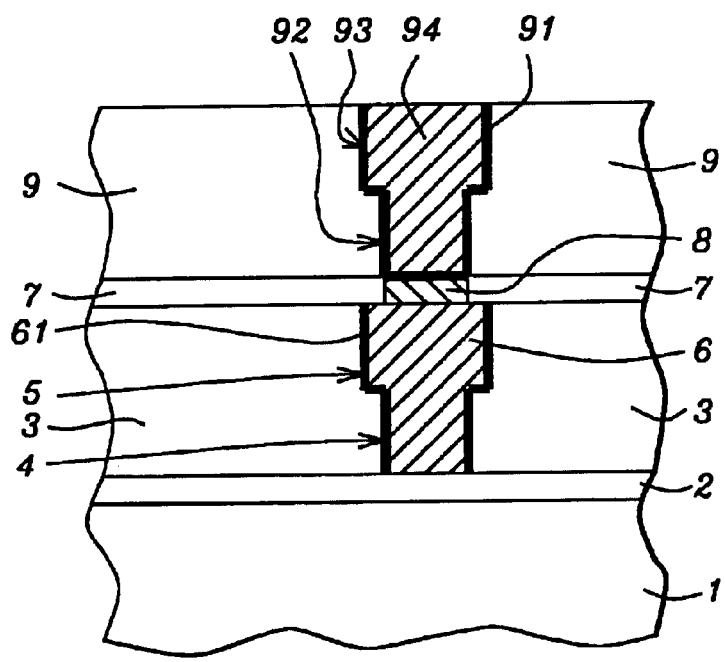
FIG. 1 – Prior Art
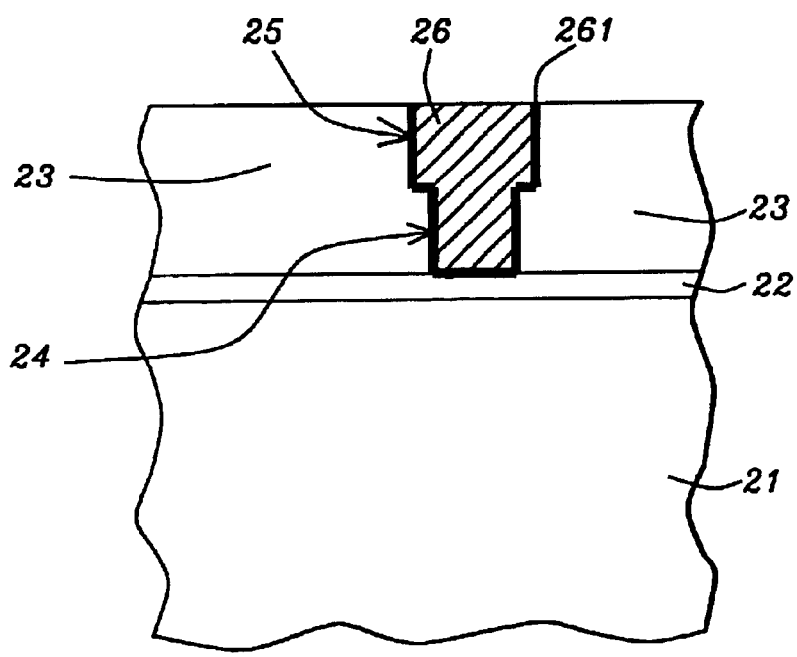
FIG. 2A

METHOD OF FABRICATING SELF-ALIGNED METAL BARRIERS BY ATOMIC LAYER DEPOSITION ON THE COPPER LAYER

BACKGROUND OF THE INVENTION (1) Field of the Invention

This invention relates to a method of fabrication used for semiconductor integrated circuit devices, and more specifically for fabricating self-aligned metal barriers by atomic layer deposition, ALD, capable of producing extremely thin, uniform, and conformal metal barrier films, selectively depositing on copper, not on silicon dioxide interlevel dielectric, in multi-layer dual damascene trench/via processing.

(2) Description of Related Art

In this section a description of related Prior Art background patents follows.

U.S. Pat. No. 6,274,932 B1 entitled "Semiconductor Device Having Metal Interconnection Comprising Metal Silicide And Four Conductive Layer" granted Aug. 14, 2001 to Mikagi describes a tantalum barrier layer for a copper dual damascene interconnect. A semiconductor device has a metal interconnection that includes an insulating film provided on a semiconductor substrate. An interlayer contact hole is formed in the insulating film. A metal silicide layer is provided at the bottom of the interlayer contact hole. A first conductive film comprises a single or a plurality of metal films provided on the insulating film and the interlayer contact hole. A second conductive film is provided in the interlayer contact hole. A third conductive film is provided on the first conductive film and the second conductive film. A fourth conductive film is provided on the third conductive film. This semiconductor device has improved durability with respect to electromigration.

U.S. Pat. No. 6,287,965 B1 entitled "Method Of Forming Metal Layer Using Atomic Layer Deposition And Semiconductor Device Having The Metal Layer As Barrier Metal Layer Or Upper Or Lower Electrode OF Capacitor" granted Sep. 11, 2001 to Kang et al. describes a Ta or Nb atomic layer deposited layer as a metal barrier layer. A method of forming a metal layer having excellent thermal and oxidation resistant characteristics using atomic layer deposition is provided. The metal layer includes a reactive metal (A), an element (B) for the amorphous combination between the reactive metal (A) and nitrogen (N), and nitrogen (N). The reactive metal (A) may be titanium (Ti), tantalum (Ta), tungsten (W), zirconium (Zr), hafnium (Hf), molybdenum (Mo) or niobium (Nb). The amorphous combination element (B) may be aluminum (Al), silicon (Si) or boron (B). The metal layer is formed by alternately injecting pulsed source gases for the elements (A, B and N) into a chamber according to atomic layer deposition to thereby alternately stack atomic layers. Accordingly, the composition ratio of a nitrogen compound (A-B—N) of the metal layer can be desirably adjusted just by appropriately determining the number of injection pulses of each source gas. According to the composition ratio, a desirable electrical conductivity and resistance of the metal layer can be accurately obtained. The atomic layers are individually deposited, thereby realizing excellent step coverage even in a complex and compact region. A metal layer formed by atomic layer deposition can be employed as a barrier metal layer, a lower electrode or an upper electrode in a semiconductor device.

U.S. Pat. No. 6,284,646 B1 entitled "Methods Of Forming Smooth Conductive Layers For Integrated Circuit Devices" granted Sep. 4, 2001 to Leem describes a Ta barrier layer deposited by atomic layer deposition. The method for forming a metal layer for an integrated circuit device includes forming a first conductive layer on an integrated circuit substrate. While forming the first conductive layer, a reflection index of the first conductive layer is monitored, and the formation of the first conductive layer is terminated when the reflection index of the first conductive layer reaches a predetermined value. More particularly, the first conductive layer can be an aluminum layer having a thickness in the range of approximately 500 Angstroms to 1500 Angstroms.

U.S. Pat. No. 6,291,334 B1 entitled "Etch Stop Layer For Dual Damascene Process" granted Sep. 18, 2001 to Somekh et al. describes a Ta barrier layer in a dual damascene process. The method provides a carbon based etch stop, such as a diamond like amorphous carbon, having a low dielectric constant and teaches a method of forming a dual damascene structure. The low k etch stop is preferably deposited between two dielectric layers and patterned to define the underlying interlevel contacts/vias. The second or upper dielectric layer is formed over the etch stop and patterned to define the intralevel interconnects. The entire dual damascene structure is then etched in a single selective etch process which first etches the patterned interconnects, then etches the contact/vias past the patterned etch stop. The etch stop has a low dielectric constant relative to a conventional SiN etch stop, which minimizes the capacitive coupling between adjacent interconnect lines. The dual damascene structure is then filled with a suitable conductive material such as aluminum or copper and planarized using chemical mechanical polishing.

U.S. Pat. No. 6,281,127 B1 entitled "Self-Passivation Procedure For A Copper Damascene Structure" granted Aug. 28, 2001 to Shue shows a barrier cap over a copper dual damascene interconnect. Processes for creating a boron containing copper region, in a top portion of a copper damascene structure, are disclosed. The boron containing copper region, used to protect exposed regions of the copper damascene structure, from reactants used for subsequent processing procedures, can be formed via ion implantation of boron ions, placed in exposed regions of the copper damascene structure, after completion of an initial CMP procedure. The copper damascene structure is then protected by the boron containing copper region, during subsequent processing procedures, such as a final CMP procedure, employed to insure complete removal of unwanted materials, as well as during subsequent CVD procedures, using $NH_3$ and $SiH_4$, as reactants.

U.S. Pat. No. 6,258,713 B1 entitled "Method For Forming Dual Damascene Structure" granted Jul. 10, 2001 to Yu et al. shows a cap barrier layer over a copper dual damascene interconnect. A first dielectric layer is formed over a substrate, and then the first dielectric layer is planarized. The first dielectric layer is etched to form a dual damascene opening that includes a via opening and a trench. The via opening exposes a conductive layer in the substrate. A metallic is formed in the via openings and the trenches so that a metallic interconnect and a via are formed at the same time. A cap layer is formed on the metallic layer. An additional etching stop layer may form on the cap layer and the substrate. A second dielectric layer is formed over the substrate. The second dielectric layer is etched to form a via opening that exposes a portion of the cap layer.

SUMMARY OF THE INVENTION

An improved and new process for fabricating self-aligned metal barriers by atomic layer deposition, ALD, capable of producing extremely thin, uniform, and conformal metal barrier films, selectively depositing on copper, not on silicon dioxide interlevel dielectric, in multi-layer dual damascene trench/via processing. Silicon nitride is presently used as a insulating copper barrier. However, silicon nitride has a relatively high dielectric constraint, which deteriorates ICs with increased RC delay. Copper metal barriers of niobium and tantalum have been deposited by atomic layer deposition on copper. With high deposition selectivity, the barrier metal is only deposited over copper, not on silicon dioxide, which eliminates the need of an insulating barrier of silicon nitride.

In a brief summary, the key points of the present invention are the use of atomic layer deposition, ALD, for selective deposition of Nb or Ta, as a barrier layer in between two layers of copper metal wiring, in a multi-layer dual damascene trench/via process. The ALD technique produces extremely thin, uniform (<3%) and conformal (100%) films. In addition, ALD of metal thin films has proven to be highly selective for deposition on copper, and not on silicon dioxide, insulating layers. This eliminates the conventional, Prior Art method of needing to deposit an insulating barrier layer of silicon nitride over copper and silicon dioxide, which has deleterious RC delay problems. Since the barrier layers, Nb or Ta, produced by the ALD method of the present invention are highly conductive metal, with lower sheet resistivity than conventional metal nitride barriers, RC delay is further reduced. In addition, both niobium or tantalum can be deposited using halide precursors, consisting of $NbCl_5$ for Nb barriers, or $TaCl_5$ for Ta barriers. For niobium, there is another alternate method by using an aqueous metal-organic precursor, Peroxo-Citrato-Niobium complex, $[NbO(O_2)(C_6H_4O_7)]^3$. These barriers have the advantage of being self-aligned, copper metal barriers.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include:

FIG. 1, which in cross-sectional representation illustrate the convention, Prior Art method of using a conventional dielectric, $Si_3N_4$, and TaN barrier layers.

FIGS. 2A–2D, which in cross-sectional representation illustrate the method of the present invention.

DESCRIPTION OF THE PREFERRED EMBODIMENTS

Figure 2B:
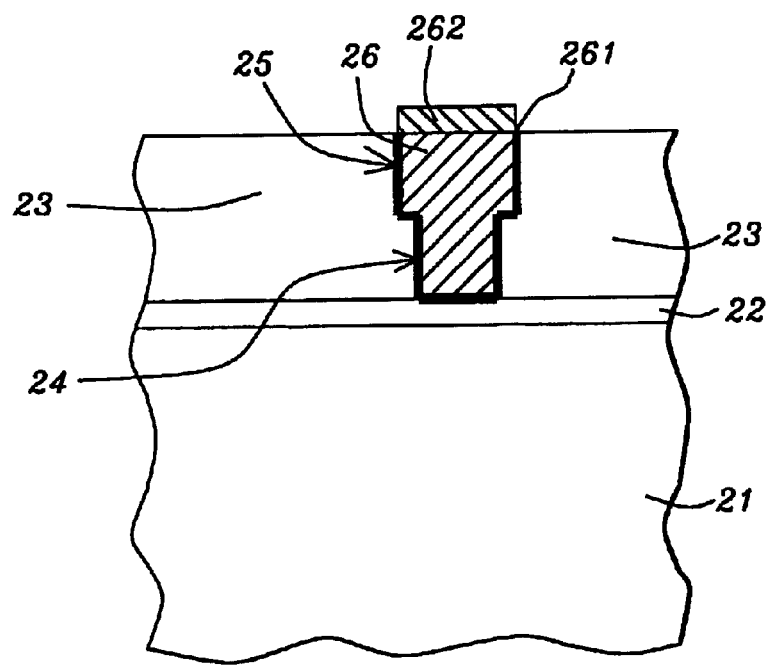

An improved and new process for fabricating self-aligned metal barriers by atomic layer deposition, ALD, capable of producing extremely thin, uniform, and conformal metal barrier films, selectively depositing on copper, not on silicon dioxide interlevel dielectric, in multi-layer dual damascene trench/via processing. Silicon nitride is presently used as a insulating copper barrier. However, silicon nitride has a relatively high dielectric constraint, which deteriorates ICs with increased RC delay. Copper metal barriers of niobium and tantalum have been deposited by atomic layer deposition on copper. With high deposition selectivity, the barrier metal is only deposited over copper, not on silicon dioxide, which eliminates the need of an insulating barrier of silicon nitride.

Referring to FIG. 1, which in cross-sectional representation illustrates the convention, Prior Art method of using a conventional dielectric, $Si_3N_4$, and TaN barrier layers. The substrate 1, in FIG. 1, is a semiconductor substrate with active device therein and provided with a first insulator layer 2 thereon. Moreover, the semiconductor substrate includes semiconductor device structures such as gate electrodes and source/drain regions and multiple levels of metal interconnections. An intermetal dielectric layer, IMD, second insulator layer 3 is deposited over the first insulator layer 2. Photo resist is deposited and patterned over the intermetal dielectric layer, the second insulator layer 3. Again Referring to FIG. 1, the formation of a via 4 (arrow) and trench 5 (arrow) is depicted. This is accomplished by anisotropically etching the intermetal dielectric layer, the second insulator layer 3 in exposed photoresist regions, using two photoresist masking steps, one for via and one for trench. The formation of copper metal 6 interconnection lines, wiring, and contact via is sketched in FIG. 1. Firstly, a metal diffusion barrier layer is deposited over the intermetal dielectric layer, the second insulator layer 3. This barrier layer is very thin and difficult to illustrate. Next, a thin copper seed layer is deposited over the barrier layer. These two aforementioned conducting layers, barrier and seed layer, termed "61", are thin and difficult to illustrate. Next, a thick copper layer is electrochemically plated on the copper seed forming an excess of copper on the surface of the IMD. This excess copper is removed from the surface of the IMD, as well as, the seed and barrier materials, by planarization using chemical mechanical polishing, CMP. By using this CMP process, the formation of a first set of copper metal 6 interconnection lines, wiring, and contact via is accomplished.

Again, referring to FIG. 1, another intermetal dielectric layer, IMD, the third insulator layer 7, is deposited over the second insulator layer 3, a thin layer of $Si_3N_4$. Formed within the third insulator layer 7, is a conventional TaN 8 conductive barrier layer. A second set of trench 92 and via 93 are formed, by repeating the processes outlined above, using a fourth insulator layer 9. Barrier and copper seed layer 91, very thin, conductive and difficult to illustrate are formed. Copper is again formed by electrode plating and planarized by chemical mechanical polishing to form a second set of copper metal 94 interconnection lines, wiring, and contact via. In summary of FIG. 1, Prior Art, the key points are that by using a conventional dielectric, $Si_3N_4$, as an insulating copper barrier, along with conventional TaN barrier layer, increased RC time constant delays occur in the IC's present. This, along with these additional, extra processing steps, are the prime disadvantages of Prior Art methods.

Referring to FIGS. 2A–2D, which in cross-sectional representation illustrate the method of the present invention, which is an improved method for fabricating self-aligned metal barriers by atomic layer deposition, ALD. The ALD method is capable of producing extremely thin, uniform, and conformal metal barrier films, selectively depositing on copper, in a multi-layer dual damascene trench/via process.

Referring to FIG. 2A, which in cross-sectional representation illustrates the first part of the present invention. The substrate 21, in FIG. 2A, is a semiconductor substrate with active device therein and provided with a first insulator layer 22 thereon. Moreover, the semiconductor substrate includes semiconductor device structures such as gate electrodes and source/drain regions and multiple levels of metal interconnections. An intermetal dielectric layer, IMD, second insulator layer 23, $SiO_2$, is deposited over the first insulator layer 22. Photo resist is deposited and patterned over the intermetal dielectric layer, the second insulator layer 23. Again referring to FIG. 2A, the formation of a first set of via 24 (arrow) and trench 25 (arrow) is depicted. This is accomplished by anisotropically etching the intermetal dielectric layer, the second insulator layer 23 in exposed photoresist regions, using two photoresist masking steps, one for via and one for trench. The formation of copper metal 26 interconnection lines, wiring, and contact via is sketched in FIG. 2A. Firstly, a metal diffusion barrier layer is deposited over the intermetal dielectric layer, the second insulator layer 23. This barrier layer is very thin and difficult to illustrate and consists of conductive Ta. Next, a thin copper seed layer is deposited over the barrier layer. These two aforementioned conducting layers, barrier and seed layer, termed "261", are thin and difficult to illustrate. Next, a thick copper layer is electrochemically plated on the copper seed forming an excess of copper on the surface of the IMD. This excess copper is removed from the surface of the IMD, as well as, the seed and barrier materials, by planarization using chemical mechanical polishing, CMP. By using this CMP process, the formation of a first set of copper metal 26 interconnection lines, wiring, and contact via is accomplished.

Note, that the above mentioned processes form a first set of copper metal interconnection lines, wiring, and contact vias is comprised of: a tantalum, Ta, barrier layer, a copper seed layer of Cu, and a plated copper layer thereon. Both the Ta barrier layer and copper seed layer are deposited by physical vapor deposition, PVD, and the copper is plated by a conventional electrochemical plating technique, with respective thickness being: Ta barrier layer from 50 to 300 Angstroms, copper seed layer approximately 1500 Angstroms, and plated copper layer approximately 10000 Angstroms. A subsequent second set of copper metal interconnection lines, wiring, and contact vias are formed, described in FIG. 2D, that are similar to the first set described above.

Referring to FIG. 2B, which in cross-sectional representation illustrates the key embodiment of the present invention, which is an improved method for fabricating self-aligned metal barriers by atomic layer deposition, ALD. Therefore, next in the process, an extremely thin, uniform, and conformal metal barrier film 262, is selectively deposited by atomic layer deposition, ALD, on copper metal 26, in a multi-layer dual damascene trench/via process. The conformal metal barrier film 262 consists of Nb or Ta metal Note, the self-aligned, copper metal barrier (262) on the first set (26) of copper metal interconnection lines, wiring, and contact vias is metal, selected from the group comprised of niobium, Nb, and tantalum, Ta, selectively deposited on the first set (26) of copper metal interconnection lines, wiring, and contact vias, by atomic layer chemical vapor epitaxy deposition, in a thickness range between 250 to 300 Angstroms. The ALD deposition conditions are: temperature between 250 to 400° C., and pressure between 0.5 to 1.5 Torr.

Figure 2C:
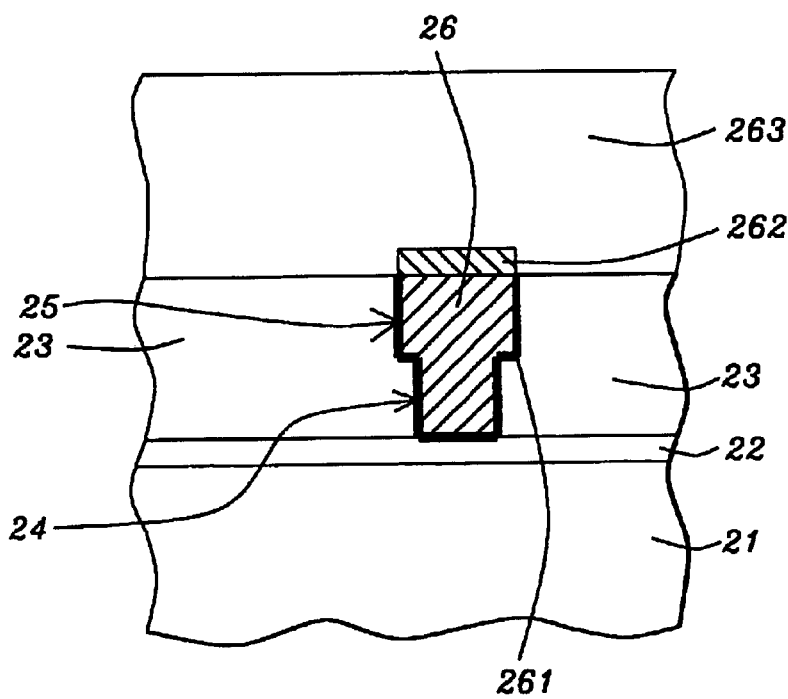

Referring to FIG. 2C, which in cross-sectional representation illustrates the another key embodiment of the present invention, which is an improved method for depositing yet another intermetal dielectric layer, IMD, the third insulator layer 263, $SiO_2$, is deposited over the second insulator layer 23, and directly over the conformal metal barrier film 262. Note, with high deposition selectivity, the barrier metal 262 is only deposited over copper 26, not on silicon dioxide, and thus, eliminates the need of an insulating barrier of silicon nitride, as is the case for Prior Art methods.

Note, that the second and third insulator layers, intermetal dielectric layers, are comprised of low dielectric constant material or materials selected from the group comprised of: silicon nitride, $Si_3N_4$, silicon oxide, SiO, spin-on glass, SOG, silicon dioxide, $SiO_2$, PE plasma enhanced TEOS, tetraethoxysilane deposition, halogenated SiO, fluorinated silicate glass, FSG, un-doped silicate glass, USG, boro phosphosilicate glass, BPSG. These layers are deposited in a thickness range from 2000 to 10000 Angstroms. The insulating layers are deposited by various methods which are selected from the group comprised of: plasma enhanced chemical vapor deposition, low pressure chemical vapor deposition, and spin coating.

Figure 2D:
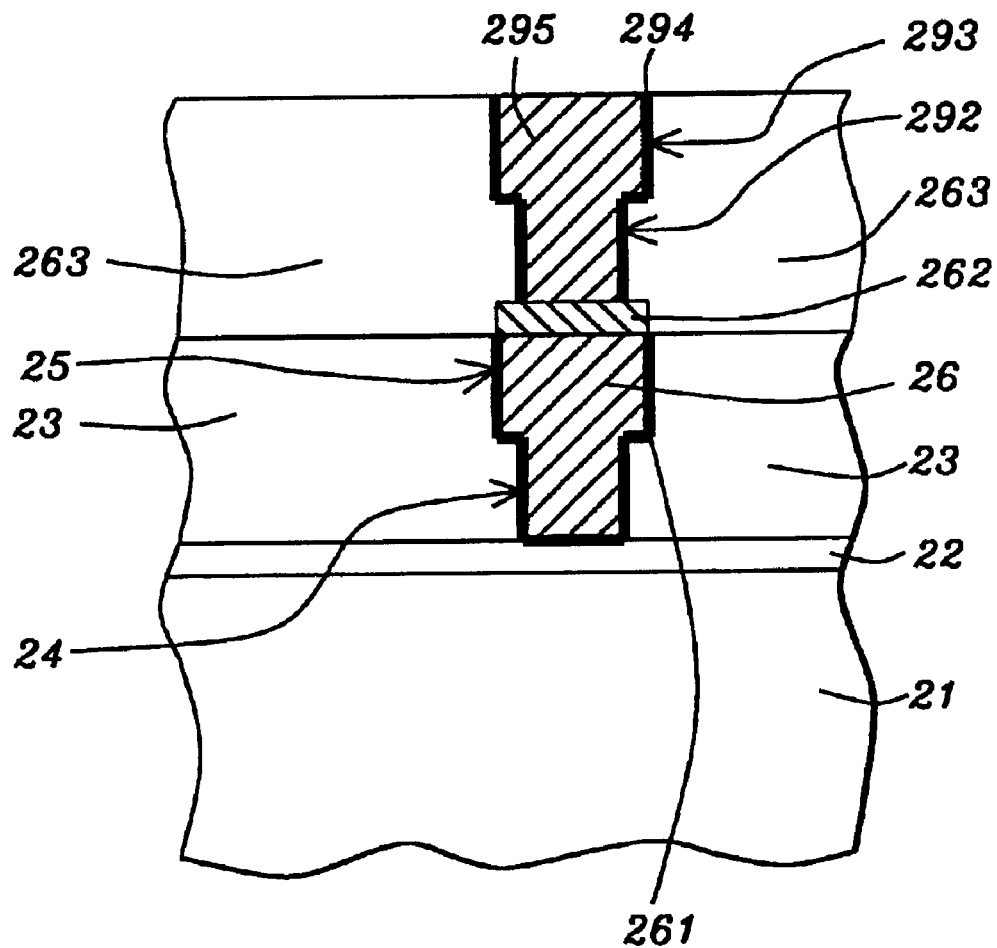

Referring to FIG. 2D, which in cross-sectional representation illustrates the final part of the present invention, in a multi-layer dual damascene trench/via process. A second set of trench 293 (arrow) and via 292 (arrow) are formed, by repeating the processes outlined above, using the third insulator layer 263. Again, conductive barrier, TaN, and copper seed layer 294, very thin, conductive and difficult to illustrate are formed. Copper is again formed by electrode plating and planarized by chemical mechanical polishing to form a second set of copper metal 295 interconnection lines, wiring, and contact via. Note, multi-layer copper wiring, can be processed in dual damascene processing by repeating the above described processing steps.

In summary, the key points of the present invention are the use of atomic layer deposition, ALD, for selective deposition of Nb or Ta, as barrier layer (262) in FIG. 2D. ALD produces extremely thin, uniform (<3%) and conformal (100%) films. In addition, ALD of metal thin films has proven to be highly selective for deposition on copper, and not on silicon dioxide, insulating layers. This eliminates the conventional, Prior Art method of needing to deposit an insulating barrier layer of silicon nitride over copper and silicon dioxide, which has deleterious RC delay problems. Since the barrier layers, Nb or Ta, produced by the ALD method of the present invention are highly conductive metal, with lower sheet resistivity than conventional metal nitride barriers, RC delay is further reduced. In addition, both niobium or tantalum can be deposited using halide precursors, comprised of: $NbCl_5$ for Nb barriers, or $TaCl_5$ for Ta barriers. For niobium, there is another alternate method by using an aqueous metal-organic precursor, Peroxo-Citrato-Niobium complex, $[NbO\ (O_2)(C_6H_4O_7)]^3$. These barriers have the advantage of being self-aligned, copper metal barriers.

While the invention has been particularly shown and described with reference to the preferred embodiments thereof, it will be understood by those skilled in the art that various changes in form and details may be made without departing from the spirit and scope of the invention.

What is claimed is:

1. A method for fabricating self-aligned, copper metal barriers, in a dual damascene multi-layer copper wiring process, the method comprising the following steps:

(a) providing a semiconductor substrate having a first insulator layer thereon;

(b) forming a second insulator layer, an intermetal dielectric layer, over said first insulator layer;

(c) forming a first set of trench and via openings in said second insulator layer;

(d) forming a first set of copper metal interconnection lines, wiring, and contact vias filling said first set trench and via openings;

(e) selectively deposited by atomic layer deposition a self-aligned, copper metal barrier on said first set of copper metal interconnection lines, wiring, and contact vias;

(f) forming a third insulator layer, another intermetal dielectric layer, over said second insulator layer;

(g) forming a second set of trench and via openings in said third insulator layer;

(h) forming a second set of copper metal interconnection lines, wiring, and contact vias filling said second set trench and via openings, thus completing using dual damascene, the multi-layer copper wiring process.

2. The method of claim 1, wherein said semiconductor substrate includes semiconductor device structures such as gate electrodes arid source/drain regions.

3. The method of claim 1, wherein said semiconductor substrate includes semiconductor device structures such as gate electrodes, source/drain regions and multiple levels of metal interconnections.

4. The method of claim 1, wherein said second and third insulator layers, intermetal dielectric layers, are a low dielectric constant material or materials selected from the group comprised of: silicon nitride, $Si_3N_4$, silicon oxide, SiO, spin-on glass, SOG, silicon dioxide, $SiO_2$, PE plasma enhanced TEOS, tetraethoxysilane deposition, halogenated SiO, fluorinated silicate glass, FSG, un-doped silicate glass, USG, boro phosphosilicate glass, BPSG, in a thickness range from 2000 to 10000 Angstroms, deposited by a method selected from the group comprised of: plasma enhanced chemical vapor deposition, low pressure chemical vapor deposition, and spin coating.

5. The method of claim 1, wherein said first and second set of copper metal interconnection lines, wiring, and contact vias is comprised of: a tantalum, Ta, barrier layer, a copper seed layer of Cu, and a plated copper layer thereon, whereby both the Ta barrier layer and copper seed layer are deposited by physical vapor deposition, PVD, and the copper is plated by an electrochemical plating technique, with respective thickness of: Ta barrier layer from 50 to 300 Angstroms, copper seed layer approximately 1500 Angstroms, and plated copper layer approximately 10000 Angstroms.

6. The method of claim 1, wherein the self-aligned, copper metal barrier on the first set of copper metal interconnection lines, wiring, and contact vias is metal, selected from the group comprised of niobium, Nb, and tantalum, Ta, and is selectively deposited on the first set of copper metal interconnection lines, wiring, and contact vias, by atomic layer chemical vapor epitaxy deposition, in a thickness range between 250 to 300 Angstroms, with deposition conditions: temperature between 250 to 400° C., pressure between 0.5 to 1.5 Torr.

7. The method of claim 1, wherein said copper metal barrier on said first set of copper metal interconnection lines, wiring, and contact vias is self-aligned and selectively deposited by atomic layer deposition using precursors selected from the group comprised of: halide precursors, $NbCl_5$ for Nb barriers, $TaCl_5$ for Ta barriers, and for niobium aqueous metal-organic precursor, Peroxo-Citrato-Niobium complex, $[NbO(O_2)(C_6H_4O_7)]^3$.

8. The method of claim 1, wherein said first and second set of copper metal interconnection lines, wiring, and contact vias are formed by plating copper on a copper seed layer, which is on a barrier layer and plated copper is planarized by chemical mechanical polishing.

9. The method of claim 1, wherein said multi-layer copper wiring, is processed in a dual damascene process by repeating steps (b) through (h).

10. A method for fabricating self-aligned, copper metal barriers of Nb or Ta, in a dual damascene multi-layer copper wiring process, the method comprising the following steps:

(a) providing a semiconductor substrate having a first insulator layer thereon;

(b) forming a second insulator layer, an intermetal dielectric layer, over said first insulator layer;

(c) forming a first set of trench and via openings in said second insulator layer;

(d) forming a first set of copper metal interconnection lines, wiring, and contact vias filling said first set trench and via openings;

(e) selectively deposited by atomic layer deposition a self-aligned, copper metal barrier on said first set of copper metal interconnection lines, wiring, and contact vias consisting of a layer of Nb or Ta;

(f) forming a third insulator layer, another intermetal dielectric layer, over said second insulator layer;

(g) forming a second set of trench and via openings in said third insulator layer;

(h) forming a second set of copper metal interconnection lines, wiring, and contact vias filling said second set trench and via openings, thus completing using dual damascene, the multi-layer copper wiring process.

11. The method of claim 10, wherein said semiconductor substrate includes semiconductor device structures such as gate electrodes and source/drain regions.

12. The method of claim 10, wherein said semiconductor substrate includes semiconductor device structures such as gate electrodes, source/drain regions and multiple levels of metal interconnections.

13. The method of claim 10, wherein said second and third insulator layers, intermetal dielectric layers, are a low dielectric constant material or materials selected from the group comprised of: silicon nitride, $Si_3N_4$, silicon oxide, SiO, spin-on glass, SOG, silicon dioxide, $SiO_2$, PE plasma enhanced TEOS, tetraethoxysilane deposition, halogenated SiO, fluorinated silicate glass, FSG, un-doped silicate glass, USG, boro phosphosilicate glass, BPSG, in a thickness range from 2000 to 10000 Angstroms, deposited by a method selected from the group comprised of: plasma enhanced chemical vapor deposition, low pressure chemical vapor deposition, and spin coating.

14. The method of claim 10, wherein said first and second set of copper metal interconnection lines, wiring, and contact vias is comprised of: a tantalum, Ta, barrier layer, a copper seed layer of Cu, and a plated copper layer thereon, whereby both the Ta barrier layer and copper seed layer are deposited by physical vapor deposition, PVD, and the copper is plated by an electrochemical plating technique, with respective thickness of: Ta barrier layer from 50 to 300 Angstroms, copper seed layer approximately 1500 Angstroms, and plated copper layer approximately 10000 Angstroms.

15. The method of claim 10, wherein the self-aligned, copper metal barrier on the first set of copper metal interconnection lines, wiring, and contact vias is metal, selected from the group comprised of niobium, Nb, and tantalum, Ta, and is selectively deposited on the first set of copper metal interconnection lines, wiring, and contact vias, by atomic layer chemical vapor epitaxy deposition, in a thickness range between 250 to 300 Angstroms, with deposition conditions: temperature between 250 to 400° C., pressure between 0.5 to 1.5 Torr.

16. The method of claim 10, wherein said copper metal barrier on said first set of copper metal interconnection lines, wiring, and contact vias is self-aligned and selectively deposited by atomic layer deposition using precursors selected from the group comprised of: halide precursors, $NbCl_3$ for Nb barriers, $Tacl_5$ for Ta barriers, and for niobium aqueous metal-organic precursor, Peroxo-Citrato-Niobium complex, $[NbO(O_2)(C_6H_4O_7)]^3$.

17. The method of claim 10, wherein said first and second set of copper metal interconnection lines, wiring, and contact vias are formed by plating copper on a copper seed layer, which is on a barrier layer and plated copper is planarized by chemical mechanical polishing.

18. The method of claim 10, wherein said multi-layer copper wiring, is processed in a dual damascene process by repeating steps (b) through (h).

19. A method for fabricating self-aligned, copper metal barriers of Nb or Ta, in a dual damascene multi-layer copper wiring process, the method comprising the following steps:

(a) providing a semiconductor substrate having a first insulator layer thereon;

(b) forming a second insulator layer, an intermetal dielectric layer, over said first insulator layer;

(c) forming a first set of trench and via openings in said second insulator layer;

(d) forming a first set of copper metal interconnection lines, wiring, and contact vias filling said first set trench and via openings;

(e) selectively deposited by atomic layer deposition a self-aligned, copper metal barrier on said first set of copper metal interconnection lines, wiring, and contact vias consisting of a layer of Nb or Ta, using precursors selected from the group consisting of halide precursors, and aqueous metal-organic precursors;

(f) forming a third insulator layer, another intermetal dielectric layer, over said second insulator layer;

(g) forming a second set of trench and via openings in said third insulator layer;

(h) forming a second set of copper metal interconnection lines, wiring, and contact vias filling said second set trench and via openings, thus completing using dual damascene, the multi-layer copper wiring process.

20. The method of claim 19, wherein said semiconductor substrate includes semiconductor device structures such as gate electrodes and source/drain regions.

21. The method of claim 19, wherein said semiconductor substrate includes semiconductor device structures such as gate electrodes, source/drain regions and multiple levels of metal interconnections.

22. The method of claim 19, wherein said second and third insulator layers, intermetal dielectric layers, are a low dielectric constant material or materials selected from the group comprised of: silicon nitride, $Si_3N_4$, silicon oxide, SiO, spin-on glass, SOG, silicon dioxide, $SiO_2$, PE plasma enhanced TEOS, tetraethoxysilane deposition, halogenated SiO, fluorinated silicate glass, FSG, un-doped silicate glass, USG, boro phosphosilicate glass, BPSG, in a thickness range from 2000 to 10000 Angstroms, deposited by a method selected from the group comprised of: plasma enhanced chemical vapor deposition, low pressure chemical vapor deposition, and spin coating.

23. The method of claim 19, wherein said first and second set of copper metal interconnection lines, wiring, and contact vias is comprised of: a tantalum, Ta, barrier layer, a copper seed layer of Cu, and a plated copper layer thereon, whereby both the Ta barrier layer and copper seed layer are deposited by physical vapor deposition, PVD, and the copper is plated by an electrochemical plating technique, with respective thickness of: Ta barrier layer from 50 to 300 Angstroms, copper seed layer approximately 1500 Angstroms, and plated copper layer approximately 10000 Angstroms.

24. The method of claim 19, wherein the self-aligned, copper metal barrier on the first set of copper metal interconnection lines, wiring, and contact vias is metal, selected from the group comprised of niobium, Nb, and tantalum, Ta, and is selectively deposited on the first set of copper metal interconnection lines, wiring, and contact vias, by atomic layer chemical vapor epitaxy deposition, in a thickness range between 250 to 300 Angstroms, with deposition conditions: temperature between 250 to 400° C., pressure between 0.5 to 1.5 Torr.

25. The method of claim 19, wherein said copper metal barrier on said first set of copper metal interconnection lines, wiring, and contact vias is self-aligned and selectively deposited by atomic layer deposition using precursors selected from the group comprised of: halide precursors, $NbCl_5$ for Nb barriers, $TaCl_5$ for Ta barriers, and for niobium aqueous metal-organic precursor, Peroxo-Citrato-Niobium complex, $[NbO(O_2)(C_6H_4O_7)]^3$.

26. The method of claim 19, wherein said first and second set of copper metal interconnection lines, wiring, and contact vias are formed by plating copper on a copper seed layer, which is on a barrier layer and plated copper is planarized by chemical mechanical polishing.

27. The method of claim 19, wherein said multi-layer copper wiring, is processed in a dual damascene process by repeating steps (b) through (h).

* * * * *